(12) United States Patent
Agarwal et al.

(10) Patent No.: US 6,667,502 B1
(45) Date of Patent: Dec. 23, 2003

(54) STRUCTURALLY-STABILIZED CAPACITORS AND METHOD OF MAKING OF SAME

(75) Inventors: Vishnu K. Agarwal, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/495,719

(22) Filed: Feb. 1, 2000

Related U.S. Application Data

(63) Continuation-in-part of application No. 09/386,316, filed on Aug. 31, 1999, now abandoned.

(51) Int. Cl.[7] .................. H01L 27/108; H01L 29/76; H01L 29/94; H01L 31/119
(52) U.S. Cl. .................. 257/296; 257/303; 257/306
(58) Field of Search .................. 438/239, 253–255, 438/393, 396–398; 257/296, 303–304, 306, 307, 308, 309, 310

(56) References Cited

U.S. PATENT DOCUMENTS

| | | | |
|---|---|---|---|
| 5,236,860 A | 8/1993 | Fazan et al. ............... 437/52 |
| 5,604,696 A * | 2/1997 | Takaishi .................. 257/303 |
| 5,654,222 A | 8/1997 | Sandhu et al. ............... 438/3 |
| 5,955,758 A | 9/1999 | Sandhu et al. ............ 257/306 |
| 5,990,021 A | 11/1999 | Prall et al. ................ 438/745 |
| 6,204,178 B1 * | 3/2001 | Marsh ....................... 427/558 |
| 6,303,956 B1 * | 10/2001 | Sandhu et al. ............ 257/306 |

* cited by examiner

Primary Examiner—Wael Fahmy, Jr.
Assistant Examiner—Hoai Pham
(74) Attorney, Agent, or Firm—Dickstein Shapiro Morin & Oshinsky LLP

(57) ABSTRACT

Structurally-stable, tall capacitors having unique three-dimensional architectures for semiconductor devices are disclosed. The capacitors include monolithically-fabricated upright microstructures, i.e., those having large height/width (H/W) ratios, which are mechanical reinforcement against shear forces and the like, by a brace layer that transversely extends between lateral sides of at least two of the free-standing microstructures. The brace layer is formed as a microbridge type structure spanning between the upper ends of the two or more microstructures.

32 Claims, 14 Drawing Sheets

STRUCTURALLY-STABILIZED CAPACITORS AND METHOD OF MAKING OF SAME

CROSS REFERENCE TO RELATED APPLICATIONS

This application is a continuation-in-part of U.S. application Ser. No. 09/386,316 filed Aug. 31, 1999, now abandoned, entitled "Structurally-Stabilized Capacitors and Method of Making of Same" the disclosure of which is incorporated by reference herein.

BACKGROUND OF THE INVENTION

1. The Field of the Invention

The present invention generally relates to capacitors for semiconductor circuit memory storage devices. More particularly, the present invention relates to highly stable, robust capacitor structures in semiconductor circuit memory storage devices.

2. The Relevant Technology

In dynamic semiconductor memory storage devices it is essential that storage node capacitor cell plates be large enough to retain an adequate charge in spite of parasitic capacitances and noise that may be present during circuit operation. The ability to maintain required storage node capacitance levels in densely packed storage cells is particularly important as the density of DRAM arrays continues to increase for the foreseeable future generations of memory devices.

One known method for maintaining, as well as increasing, storage node size in densely packed memory devices is through use of self-aligned stacked-capacitor cells for 64-MB DRAMs formed as three-dimensional cylindrical container structures. FIG. 1A illustrates conventional double-sided cylindrical container structures 10 configured as a double crown structure. The cylindrical capacitor container structures 10 are formed over a first dielectric layer 1 that lies on a semiconductor substrate 12. Each of the cylindrical capacitor container structures 10 are connected to one of the source and drain impurity regions 14 and 14' of one of the transistors 13 via a conductive plug 15. The container structures 10 are double-sided in that poly cylinders 16 have a conductively doped hemispherical grain (HSG) poly layer 17 formed on both the inside and outside thereof, and a capacitor dielectric film 18 surrounds the entire surface HSG layer of the storage node electrode. Then, a top capacitor electrode 19, such as poly, is formed to complete the storage cell 10.

Referring now to FIG. 1B which shows a portion of the process for fabricating the FIG. 1A conventional cylindrical container structures, a second dielectric layer 2 is formed on the first dielectric layer 1, and a via hole 3 is formed through the second dielectric layer 2 in alignment with the plug 15 previously formed in the first dielectric layer 1, and then the polysilicon layer 16 is deposited on the cylindrical walls of the via hole. The polysilicon is removed from the upper surface of the second dielectric layer 2 by planarization (e.g., CMP) to yield the intermediate structure shown in FIG. 1B. In the next process step, the second dielectric layer 2 is selectively etched away until the first dielectric layer 1 and plug 15 is reached with the resulting structure as shown in FIG. 1C. A free standing cylindrical structure 16 is left exposed without structural support over the first dielectric layer 1 after removing the second dielectric layer 2. In further processing, the HSG 17, capacitor dielectric film 18 and electrode 19 are sequentially formed on the cylinder structures 10 to yield the double crown structure (double container cell) shown in FIG. 1A.

In FIGS. 2A–2D, a conventional fabrication scheme is shown for fabricating capacitor studs used in a high density array. In fabricating the conventional stud structures, as shown in FIG. 2A, via holes 27 are formed through a second dielectric layer 26 which is provided over a first dielectric layer 21 arranged on a semiconductor substrate 22. The substrate 22 has a transistor 23 including source and drain regions 24 and 24', and one of which is connected to the via holes 27 via conductive plug 25. After the via hole 27 is formed through the second dielectric layer 26 in alignment with the plug 25 previously formed in the first dielectric layer 1, a metal or other conductive material 28 is deposited so as to fill the via hole 27 and form the stud 28. The metal is removed from the surface of the second dielectric layer 26 by planarization (e.g., CMP) to yield the intermediate structure shown in FIG. 2B. In the next process step, the second dielectric layer 26 is selectively etched away until the first dielectric layer 21 and plug 25 is reached with the resulting structure as shown in FIG. 2C. A free standing stud structure 28 is left exposed without structural support over the first dielectric layer 21 after removing the second dielectric layer 26. In further processing, the studs 28 have a conductively doped hemi-spherical grain (HSG) poly layer 200 formed on their exterior profile, and a capacitor dielectric film 201 surrounds the entire surface HSG layer 200 of the storage node electrode. Then, a top capacitor electrode 202, such as polysilicon, is formed to complete the storage cell 20.

The present inventors have determined that the yields of double-sided container or stud structures in high density memory arrays such as illustrated in FIGS. 1A and 2D above, respectively, has been lowered because of falling problems with the containers or studs that occur during device fabrication. Namely, the containers and studs are susceptible to falling over and breaking during etch back (i.e., removal of the second dielectric layer) or other further processing operations such as deposition of the capacitor dielectric film. The conventional studs or containers have relatively high sidewalls and a relatively small supporting "footprint" and thus do not have a strong foundation at their bottoms. Consequently, they are very susceptible to toppling over when subjected to handling and/or processing forces. Nonetheless, as demand for reduced feature size continues, there remains a need to fabricate very tall studs (e.g., 1.5 μm) and tall double sided containers with relatively small "footprints". However, the fabrication of taller studs (i.e., larger height-to-width (H/W) structures) exacerbates the falling problem as a given base dimension must support even taller walls. When the conventional stud or container structures fall over they can short to an adjacent storage node poly, which will render the adjacent storage cells shorted out. In a 64 M DRAM, for instance, even if there were only one out of 100 K cells that had a short due to such falling, this would cause 640 random failures in the 64 M DRAM. This number of failures would usually exceed the limited number of redundant elements available for repair, and the entire memory device would be rendered unusable.

Consequently, a need exists in the art for container and stud structures that are not susceptible to falling problems during device fabrication and for a methodology for imparting such increased resistance to falling.

SUMMARY OF THE INVENTION

The present invention resolves the above and other problems that have been experienced in the art. More particularly, the present invention provides structurally-stable, tall capacitors having unique three-dimensional architectures for semiconductor devices. Although the concepts of this invention are particularly useful in DRAM fabrication, the invention nonetheless has wider applicability to encompass semiconductor devices in general where monolithically-fabricated upright microstructures, i.e., those having large height/width (H/W) ratios, need mechanical reinforcement against shear forces and the like that are experienced during processing and handling.

In one general embodiment, this invention concerns a monolithic semiconductor device comprising a semiconductor substrate over which are formed a plurality of upright free-standing microstructures. A brace layer is formed that transversely extends between lateral sides of at least two of the free-standing microstructures. The brace layer is formed as a microbridge type structure spanning between the upper ends of the two or more microstructures. In order to form the braces, a dielectric layer is used as a sacrificial layer in which a narrow groove is formed and within which the brace layer is formed. Then, the sacrificial dielectric layer is removed after the brace is formed to leave a reliable three-dimensional microstructure in which a container or stud is transversely supported very robustly by the brace layer. The brace layer is vertically spaced from a remaining dielectric layer to yield a braced, free-standing three-dimensional architecture that does not fall. Preferably, each brace layer ultimately extends to the edges of the IC die active circuit area, where the brace locks to solid non-active portions of the die surrounding the fabricated circuitry.

In one preferred embodiment, a method is provided to prevent the falling of studs or double-sided containers in which a small width channel is made after metal filling and planarization in the case of metal studs, or after container planarization in the case of containers for capacitors. This small channel is filled with a dielectric different from the dielectric layer in which the via hole was formed for the stud or container, and having good adhesion with electrode material. The channel formation procedure is followed by etch back of the dielectric layer, hemispherical grain deposition, capacitor dielectric deposition, and top electrode deposition, to complete formation of a capacitor.

This invention permits further maximization of capacitor storage cell surface area in a high density/high volume DRAM fabrication process. The capacitor design of the present invention defines a stacked capacitor storage cell that is useful in DRAM fabrication, however, it will be evident to one skilled in the art to incorporate these steps into other processes for providing memory cells or other integrated circuit microstructures where a large height-to-width structure is required.

BRIEF DESCRIPTION OF THE DRAWINGS

The foregoing and other features, aspects and advantages of the present invention will become more apparent from the following detailed description of the present invention when considered in conjunction with the accompany drawings, in which.

It will be understood that the drawings are provided for illustrative purposes and that the depicted features are not necessarily drawn to scale.

DETAILED DESCRIPTION OF THE PREFERRED EMBODIMENTS

The present invention is particularly directed to maximizing storage cell surface area, as well as providing uniform and repeatable, defect free, storage cell structures across a given substrate, in high density/high volume DRAM fabrication processes, although it is thought that the invention has wider applicability as will become apparent from the exemplary embodiments.

Figure 3A:
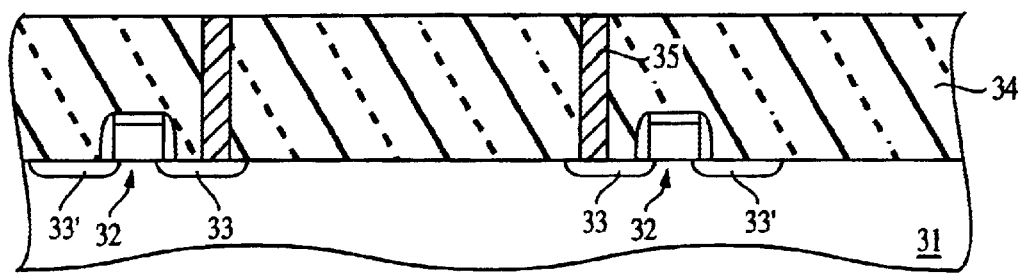
FIGS. 3A through 3F are cross sectional views illustrating a first embodiment for manufacturing cylindrical capacitor containers according to the present invention.

Referring now to FIGS. 3A–3F, a fabrication scheme for forming a double sided container capacitor of this invention is illustrated. Referring to FIG. 3A, a silicon wafer substrate 31 is prepared using conventional process steps to provide circuit elements 32 each having a conventional gate stack formed of an oxide, a conductor, such as polysilicon, and dielectric sidewall layers, and a doped diffusion regions 33 and 33'. That is, circuit elements 32 are illustrated as being transistors having source and drain impurity regions 33 and 33'. One of source and drain regions 33 and 33' of each transistor has a conductive plug 35 connected thereto which will be used to connect the transistor with a capacitor container. The term "substrate" is meant to encompass a wafer, active and passive devices formed within the wafer, and layers on the wafer such as passivation and/or metallization layers, as well as SOI and the like. A first dielectric layer 34 blankets the substrate 31. The first dielectric layer 34 typically is planarized after its deposition, such as by conventional chemical-mechanical-polishing (CMP) or reactive ion etching (RIE) used for this purpose. A polysilicon plug 35 fills a contact hole formed through the first dielectric layer 34. CMP is used to remove those portions of the poly that are deposited on the surface of the first dielectric layer 34. The wafer has been processed up to the point of processing an array of storage cell capacitors. Capacitor cell fabrication will now follow. The storage capacitor of each memory cell will make contact to the underlying diffusion region 33 via poly plug 35.

Figure 3B:
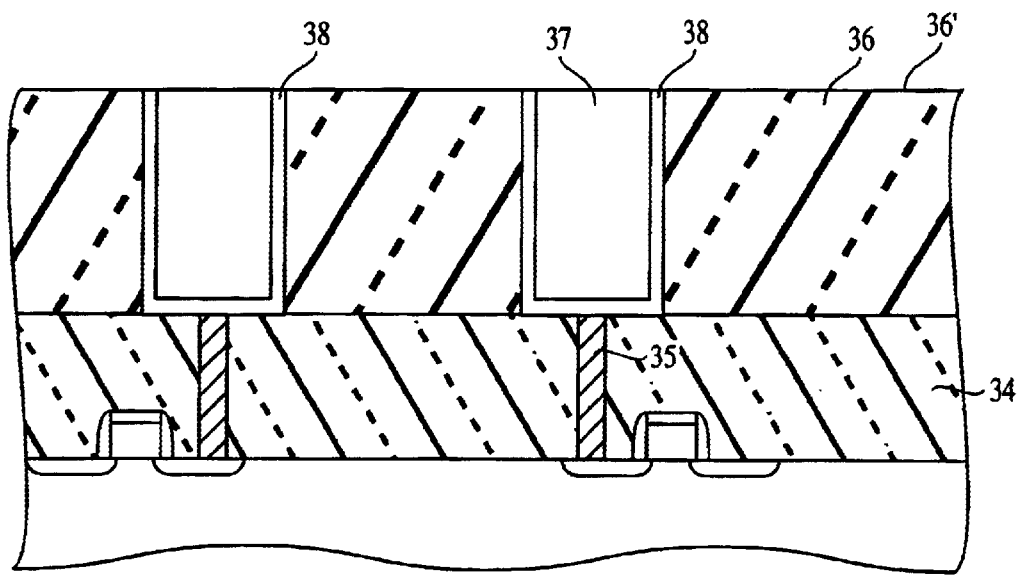

Referring to FIG. 3B, a second dielectric layer 36 is formed over the first dielectric layer 34. Then, openings (via holes) 37 are formed through the second dielectric layer 36 by an anisotropic etching technique, exposing plug 35. The first and second dielectric layers 34 and 36 preferably are selected from among $Si_3N_4$, $SiO_2$, BPSG or $Ta_2O_5$. A polysilicon layer 38 is formed over the second dielectric layer including over the walls and the plug at the bottom of the via holes. The polysilicon layer is formed of in situ doped polysilicon (poly). An appropriate planarization technique, such as CMP or RIE etching, is used to remove polysilicon on the horizontal flats of the second dielectric layer 36 in order to isolate the poly layer 38 at each container which provides the intermediate structure shown in FIG. 3B.

Figure 1A:
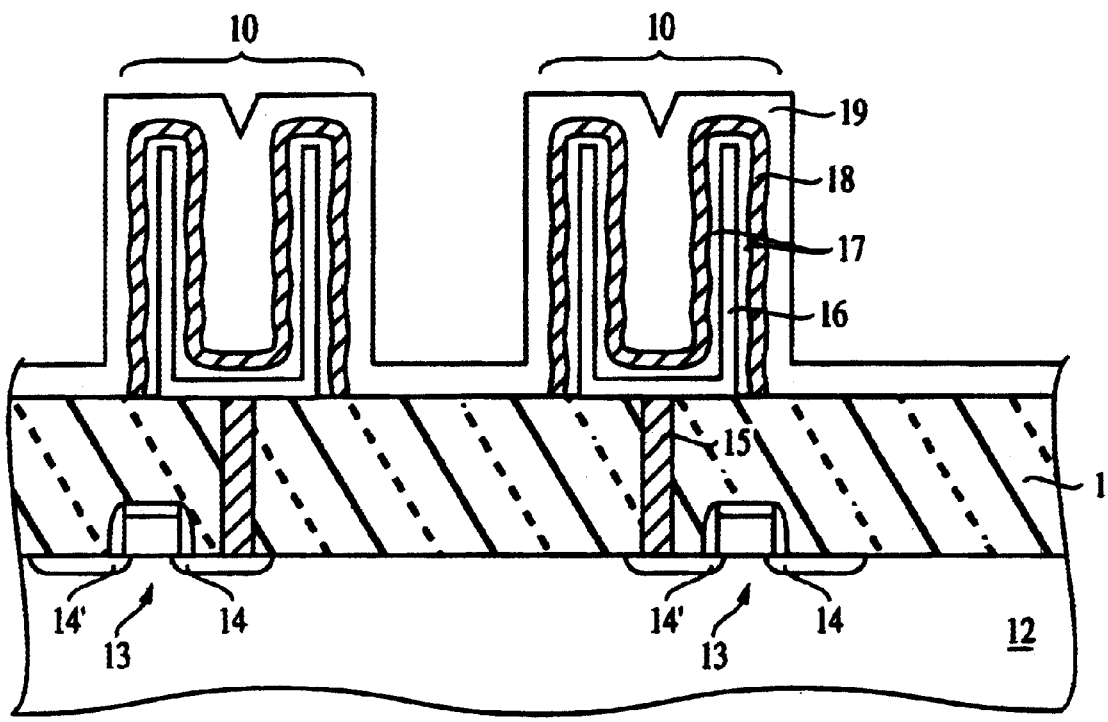
FIGS. 1A through 1C are cross sectional views illustrating a conventional fabrication scheme for manufacturing cylindrical capacitor containers.
Figure 1B:
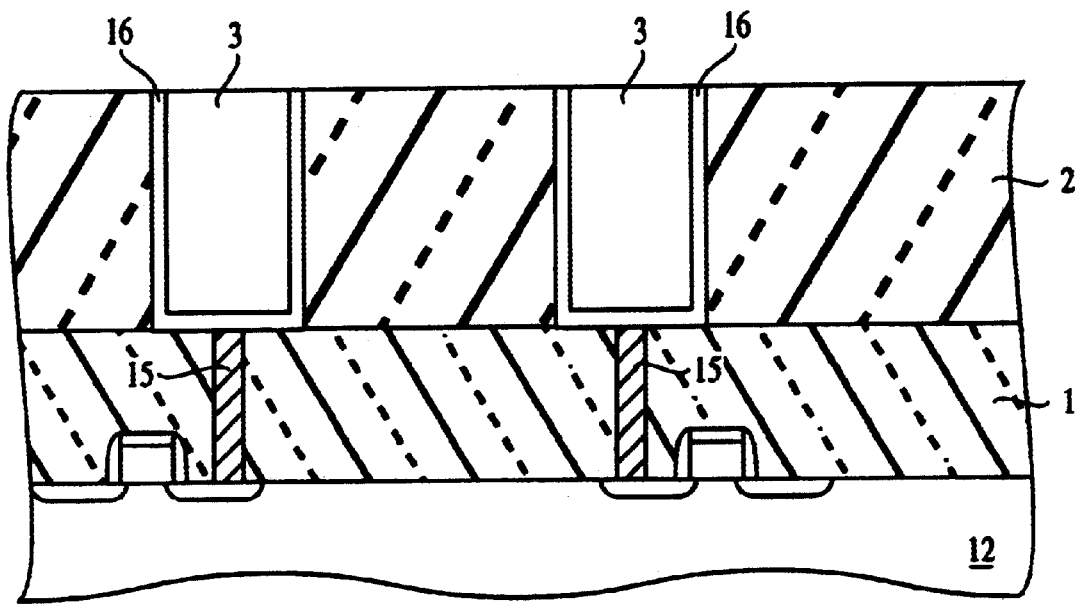
Figure 1C:
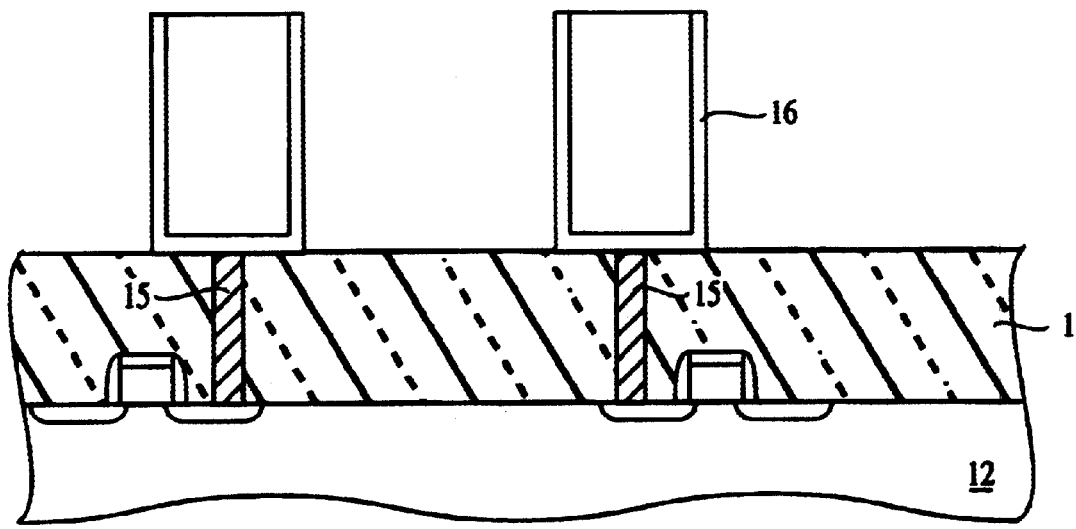
Figure 2A:
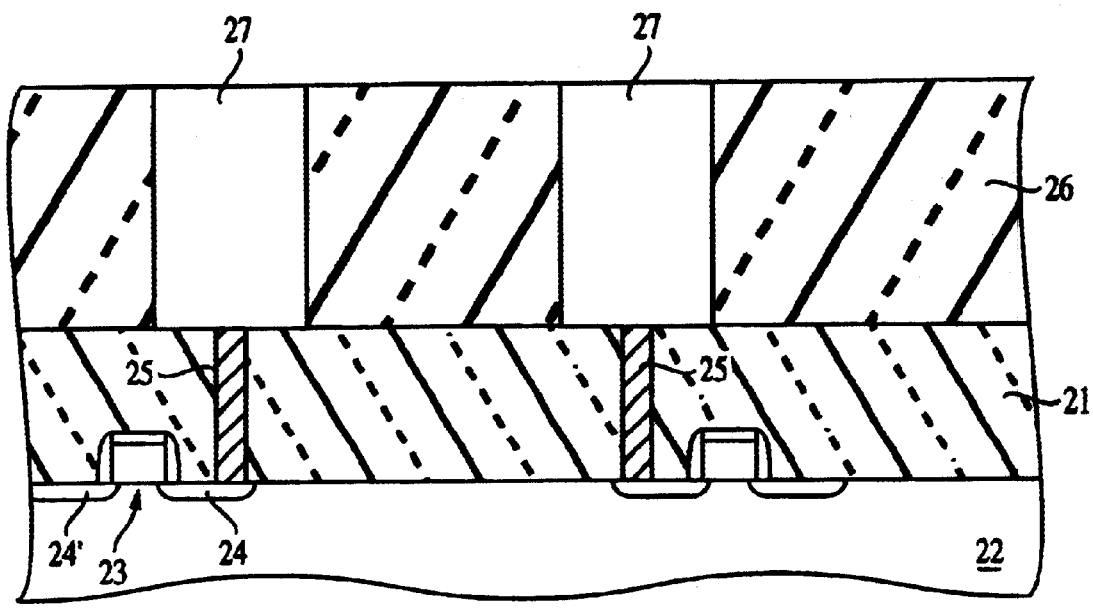
FIGS. 2A through 2D are cross sectional views illustrating a conventional fabrication scheme for manufacturing studs for a capacitor.
Figure 2B:
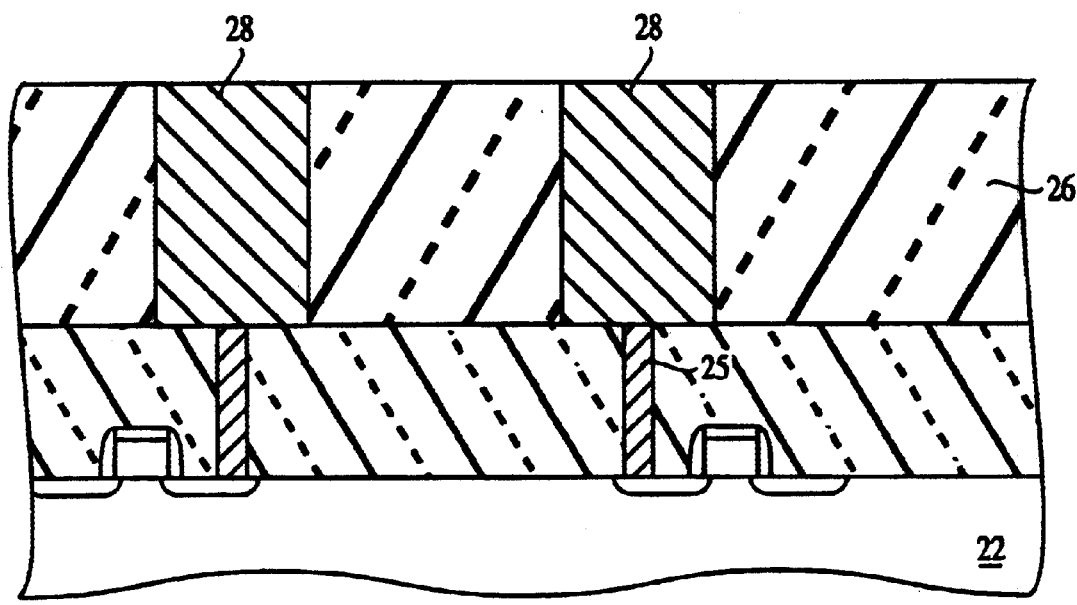
Figure 2C:
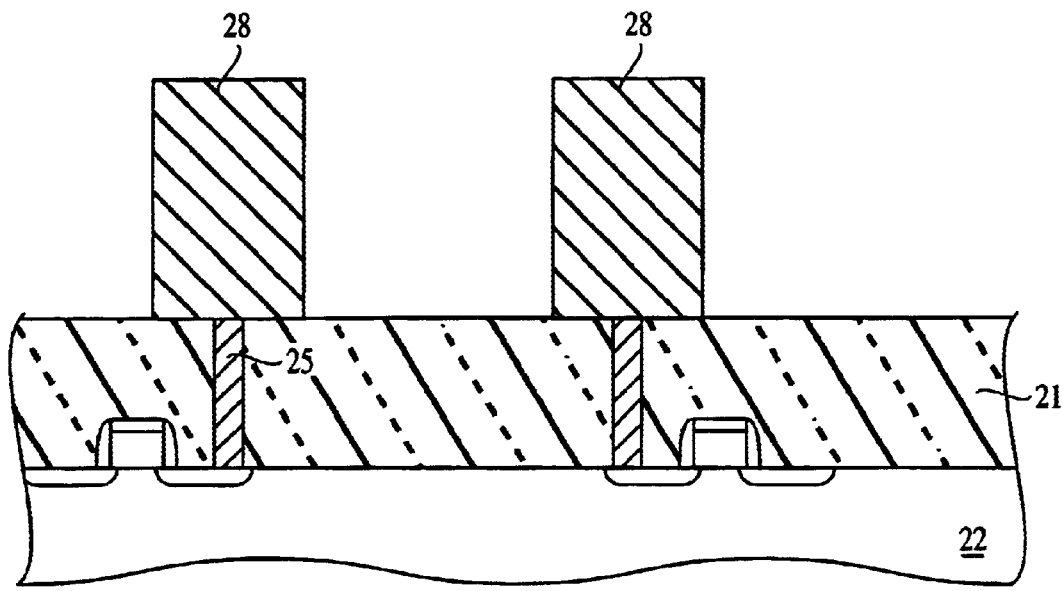
Figure 2D:
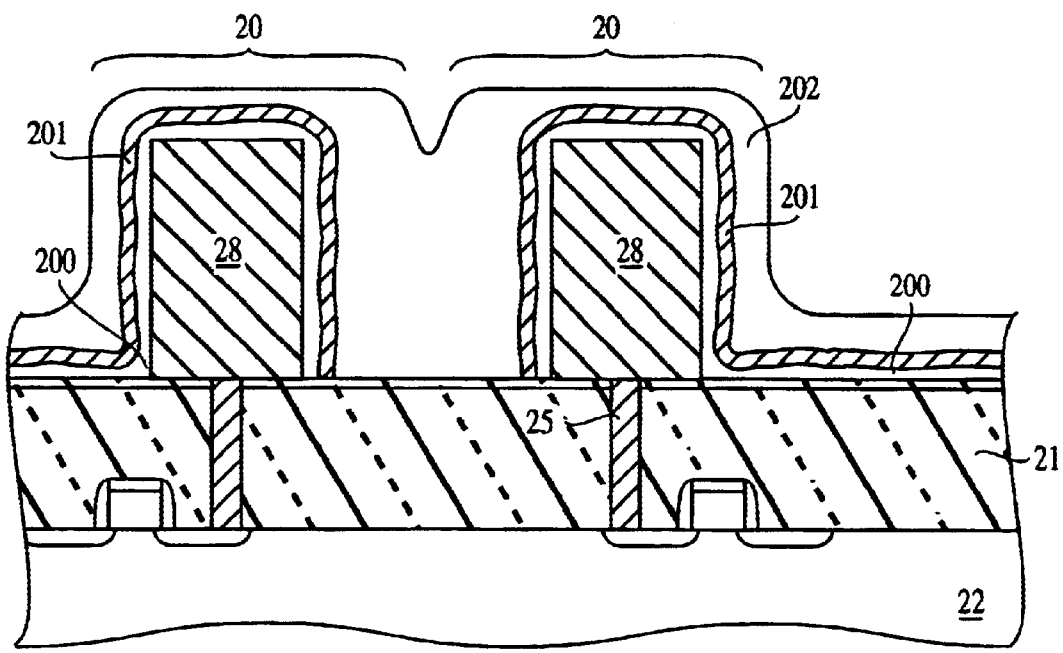
Figure 3C:
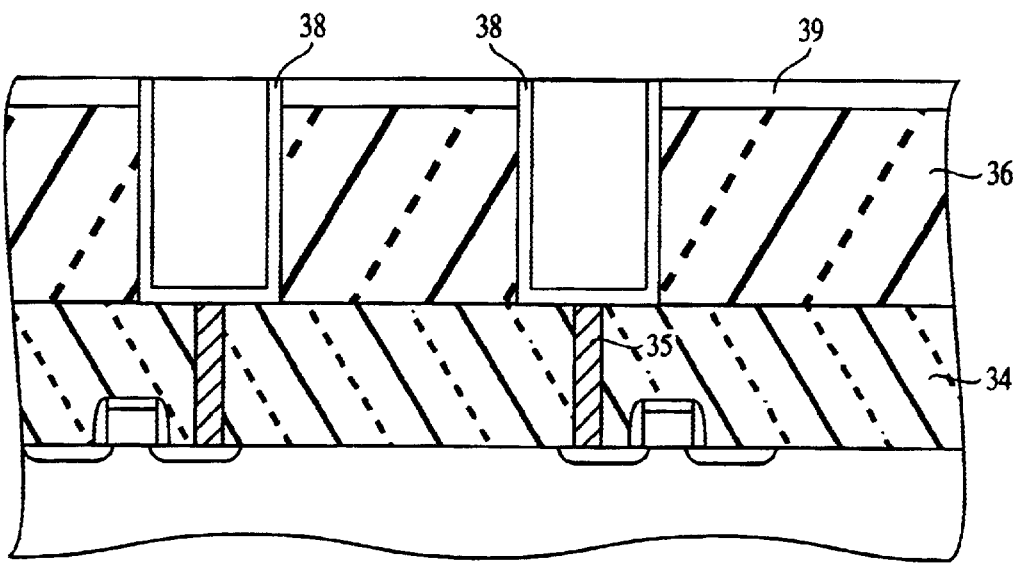
Figure 4A:
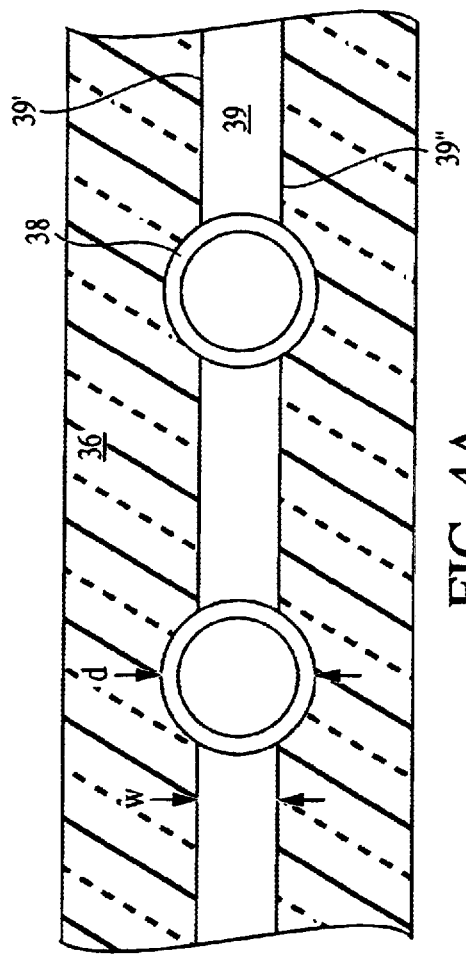
FIGS. 4A through 4B are top views of the cylindrical containers of FIGS. 3A–3F at several intermediate stages of processing.

Unlike conventional double-sided container processing, such as illustrated in FIGS. 1A–1C, the present invention does not next proceed to an etch back of the second dielectric layer 36 to the plugs 35 at this juncture of the processing. Instead, as shown in FIG.3C, a narrow channel 39 is etched into the surface 36' of the second dielectric layer 36, such as by using photolithographic techniques, such that the narrow channel 39 intersects a plurality of the polysilicon cylinders 38 at the upper ends of the cylinders 38. For example, a photoresist can be spun onto the surface of second dielectric layer 36 and into via holes 37 and then is patterned to define the location of channel 39 while protecting the rest of the surface of the second dielectric layer 36 and the openings 37 inside the poly layer 38. FIG. 4A is a top view of the corresponding intermediate structure showing the narrow channel 39 having sidewalls 39' and 39'' formed in the surface of the second dielectric layer 36. The channel width dimension "w" between sides 39' and 39'' of the channel 39 is preferably sized to be approximately the container diameter "d" or less (i.e., the largest cross-sectional dimension of the formation or less), to approximately one-half (50%) of the container diameter. The container at this stage of fabrication is a hollow cylinder.

Figure 3D:
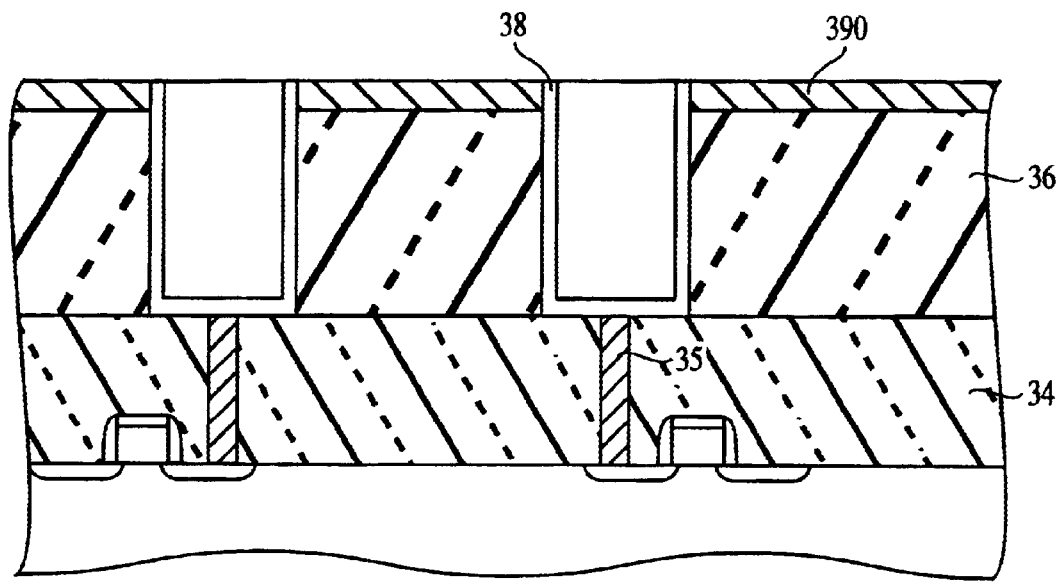
Figure 4B:
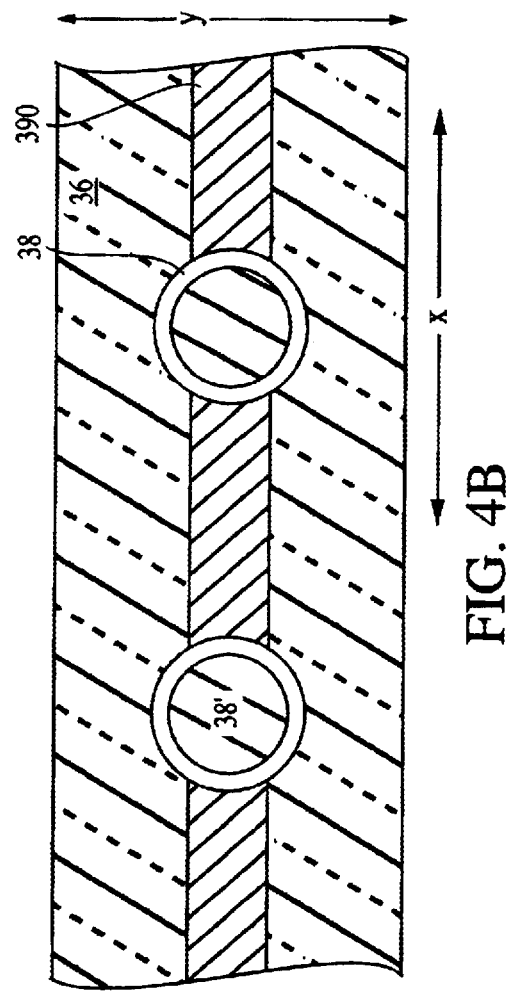

In the next processing step, illustrated in cross-section in FIG. 3D and as a top view in FIG. 4B, a dielectric layer 390 made of a different dielectric material than second dielectric layer 36 is deposited in channel 39 to form a dielectric brace layer 390 extending between polysilicon container layers 38. The container is kept masked during this step, such as with a photoresist 38', so as to prevent unwanted dielectric from entering the container during filling of channel 39. After depositing brace layer 390, CMP is conducted to planarize the surface of the device while the container is still masked.

This dielectric brace layer 390, which is deposited to prevent falling of tall containers, and studs as illustrated in another embodiment described herein, can be $Si_3N_4$, $SiO_2$, BPSG, $Ta_2O_5$ with the proviso that it is a different material from the second dielectric material such that the second dielectric can be selectively etched away (wet or dry etching) while leaving the brace dielectric layer intact in a subsequent processing step.

Figure 3E:
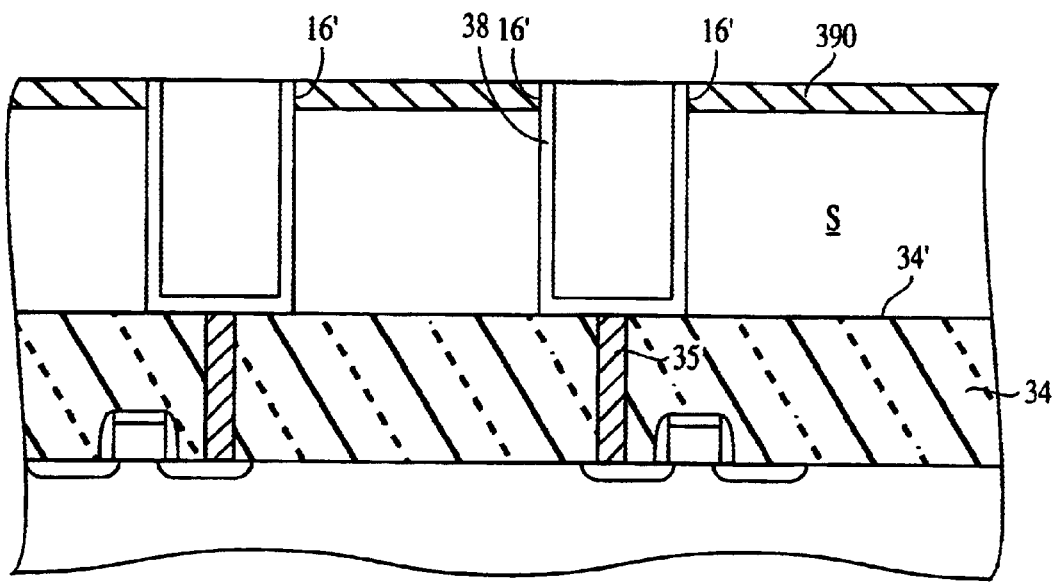

As shown in FIG. 3E, the second dielectric layer 36 is selectively etched away until the first dielectric layer 34 and plug 35 is reached while leaving the dielectric brace layer 390 intact. The brace layer 390 remains suspended between outer lateral sides 16' of the two poly cylinders 38 at their upper ends (e.g., within the upper 50%, preferably the top 25%, and more preferably the upper 10%, of the cylinder height) as a microbridge type of structure. A vertical space "s" or gap exists between the dielectric brace layer 390 and the upper surface 34' of the first dielectric layer 34. In this manner, the second dielectric layer 36 is used as a type of sacrificial layer. For example, if the second dielectric layer is BPSG or $SiO_2$ and the dielectric brace layer 390 is silicon nitride, the second dielectric layer 36 can be selectively etched away using HF or HF+water, which will not remove the silicon nitride brace layer 390. On the other hand, if silicon nitride is used as the second dielectric 36 while $SiO_2$, BPSG, or $Ta_2O_5$ is used as the dielectric brace layer 390, the silicon nitride can be selectively etch removed using phosphoric acid. A free standing cylindrical structure 38 is left exposed with transverse structural support from brace layer 390 over the first dielectric layer 34 after removing the second dielectric layer 36.

The dielectric brace layer 390 usually will extend to other containers not shown in the figures so as to form a mechanical bracing support spanning between a considerable series of different containers along the common linkage of brace layer 390. Although a plurality of separate brace layers 390 can be used, it is also possible to provide more than one dielectric brace layer where they intersect at a container (or containers) such that a two-dimensional network or lattice of dielectric brace layers is formed through-out the array of containers. Also, the depth of the channels 39 formed that determines the thickness of the dielectric brace layer 390 is a function of the H/W container dimensions, the dielectric material used, and other factors. From a functional standpoint, the size of the dielectric brace layer must be selected to be large enough to provide lateral buttressing forces sufficient to substantially if not completely prevent the falling problems, yet not be so large that the relative weight of the brace layer becomes a factor. As to the width "w" of the brace layer 390, the brace generally has a width equal to or less than the largest cross-sectional dimension of the microstructures, which is the cylinder diameter "d" for the embodiment shown in FIG. 4A.

Referring to FIG. 4B, the transverse or lateral directions mentioned herein indicate the x-and y-directions, or a combined vector thereof, across the flat major surfaces of the dielectric layers. The dielectric brace layer 390 can be deposited by chemical vapor deposition techniques conventionally used to deposit these materials. The dielectric brace material also must have good enough adhesion to a top electrode material to be applied in a later processing step such that there is no peeling during further processing.

Figure 4C:
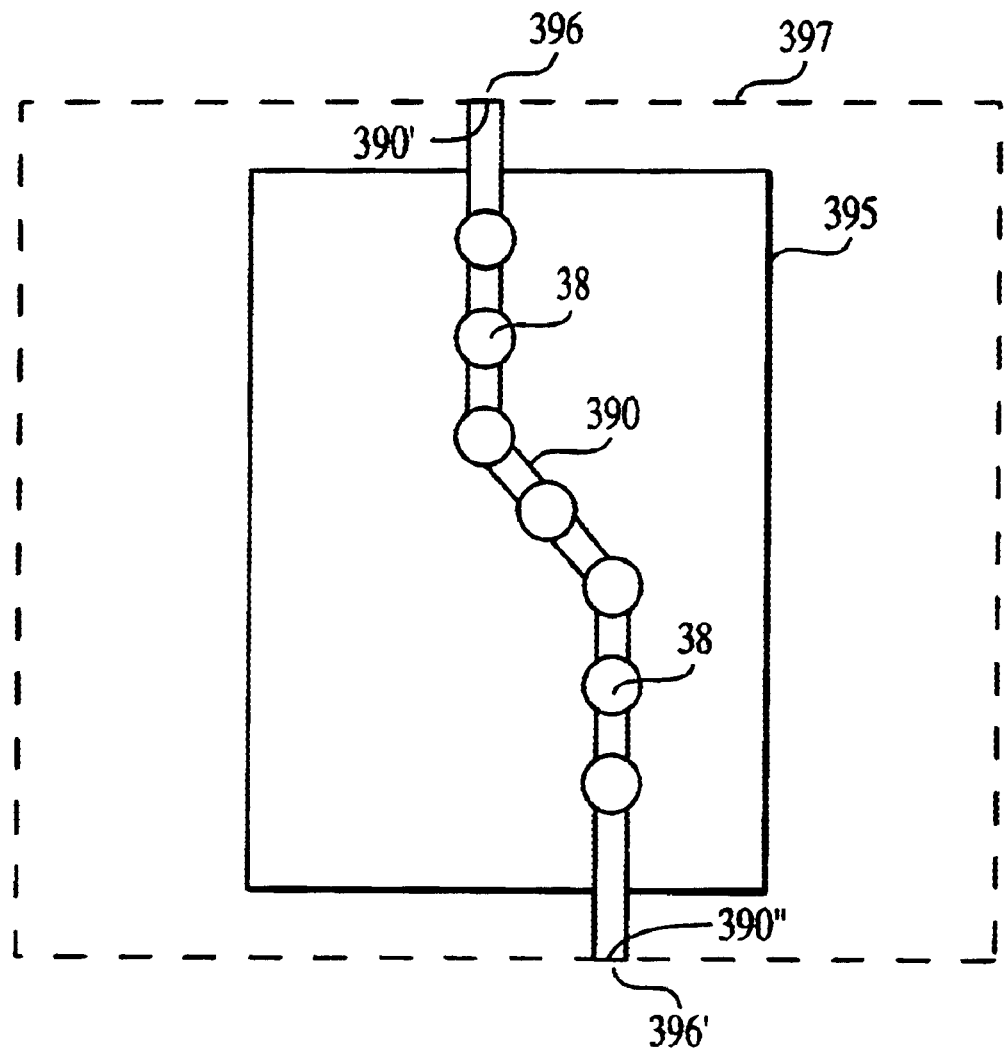
FIG. 4C is a top view of the connection of capacitor microstructures to each other and to non-active portions of a die using a microbridge brace layer according to the present invention.

Referring to FIG. 4C, each brace layer 390 not only connects a plurality of container capacitor microstructures 38 near their respective tops but it also ultimately extends to the edges of the IC die active circuit area 395, where the brace 390 locks to solid non-active portions 396 and 396' of a die 397 provided at the same elevation level as the brace layer 390. The non-active portions 396 and 396' of the die 397 are adjacent the fabricated circuitry 395. The brace layer 390 can extend linearly between the tops of capacitor microstructures 38 between non-active portions 396 and 396' of the die 397, or, as illustrated in FIG. 4C, the brace layer 390 can follow a non-linear path before being anchored at its respective ends 390' and 390'' at non-active areas 396 and 396' of the die 397. This provides an anchored system of braced-tall containers (or braced-tall stud capacitors according to a separate embodiment of this invention described in connection with FIG. 6E). In this way, the containers 38 are afforded good mechanical support in at least transverse or lateral directions to fortify the three-dimensional free-standing container microstructures to be defined during removing the second dielectric 36 and subjecting the in-process wafer to further handling and processing operations which are described below.

Figure 3F:
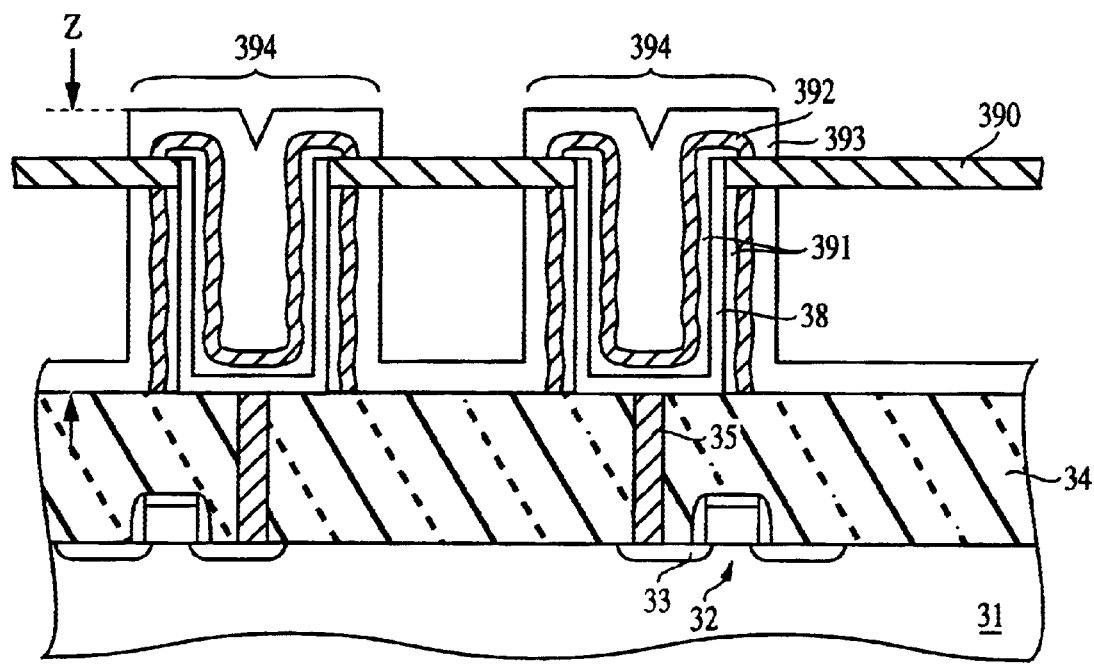

As shown in FIG. 3F, in further processing to complete the container structure after forming the brace layer 390, a conductively doped hemi-spherical grain (HSG) poly 391 is formed on both the inside and outside of the poly layer 38 thereof. This is done so that a double sided container can be fabricated. The hemispherical grain layer (HSG) can be formed by deposition or vacuum annealing the poly layer 38 according to known techniques. If the HSG is deposited, a blanket etch of the HSG typically follows that results in the formation of HSG poly that is texturized or rugged poly. A capacitor dielectric film 392 is formed that surrounds the entire surface HSG layer 391 of the storage node electrode. The capacitor dielectric can be formed of $Si_3N_4$, $Ta_2O_5$, BST, PZT, SBT, or $SiO_2$ and the like. It can be deposited by LPCVD, PECVD, and so forth, to a desired thickness with regard to the capacitance of the device. The thin dielectric film 392 can be annealed to stabilize the film. Then, a top electrode 393 is formed to provide two containers 394 configured as a double crown structure (double container cell) as shown. The electrode material can be polysilicon, HSG, Pt, $RuO_x$, Ru, Ir, Pt+Rh, TiN, $WN_x$, or TaN and the like. The top electrode 393 typically is a doped conformal poly layer that blanket covers the capacitor dielectric 392 and serves as a common capacitor cell plate to the entire array of containers formed.

The dielectric brace layer 390 takes up relatively little circumferential room around the upper end of the container (i.e., the end opposite the end in contact with first dielectric layer 34), so the HSG layer 391, capacitor dielectric 392 and top electrode 393 can be formed without being disturbed by the presence of the dielectric brace layer 390. The gap "z" between the top electrode 392 and the surface of the first dielectric layer 34 being approximately 2 μm for many capacitor structures of DRAMs. Conventional process steps are performed from this point on to complete the semiconductor device.

Figure 5A:
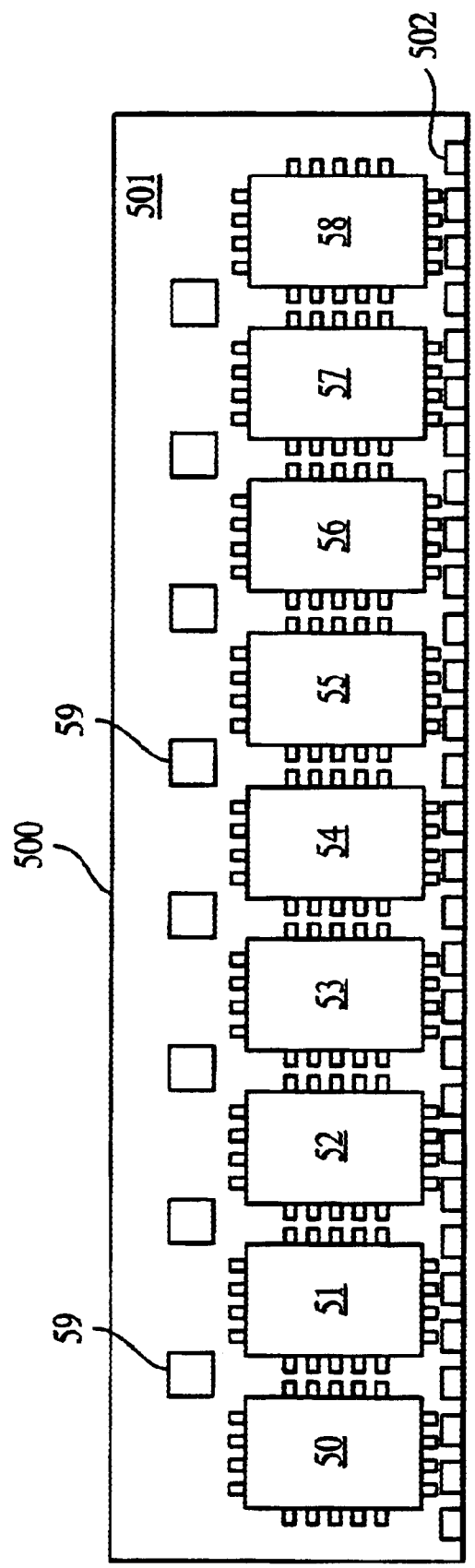
FIG. 5A is a plan view of a memory module having memory chips constructed in accordance with the present invention.

FIG. 5A is plan view of a memory module 500 having memory chips 50–58 including semiconductor memory devices constructed in accordance with the present invention. That is, chips 50–58 have a DRAM cell such as described in connection with FIG. 3F (or FIG. 6E infra). Memory module 500 is a SIMM (single in line memory module) having nine memory chips (IC's) 50–58 aligned on one side of a printed circuit board substrate. The number of such memory chips in the SIMM typically will vary between 3 to 9. The circuit board 501 has an edge connector 502 along one longitudinal edge to permit it to plug into a memory socket on a computer motherboard of conventional design (not shown). A wiring pattern (not shown), which can be a conventionally known design for this purpose, is formed on the board 501 and connects the terminals or leads shown comprising the edge connector 502 to the memory chips 50–58. Small ceramic decoupling capacitors 59 are also mounted on substrate 501 to suppress transient voltage spikes. Other than the inventive memory device structures used in memory chips 50–58, the general layout of the SIMM 500 can be a conventional construction.

Figure 5B:
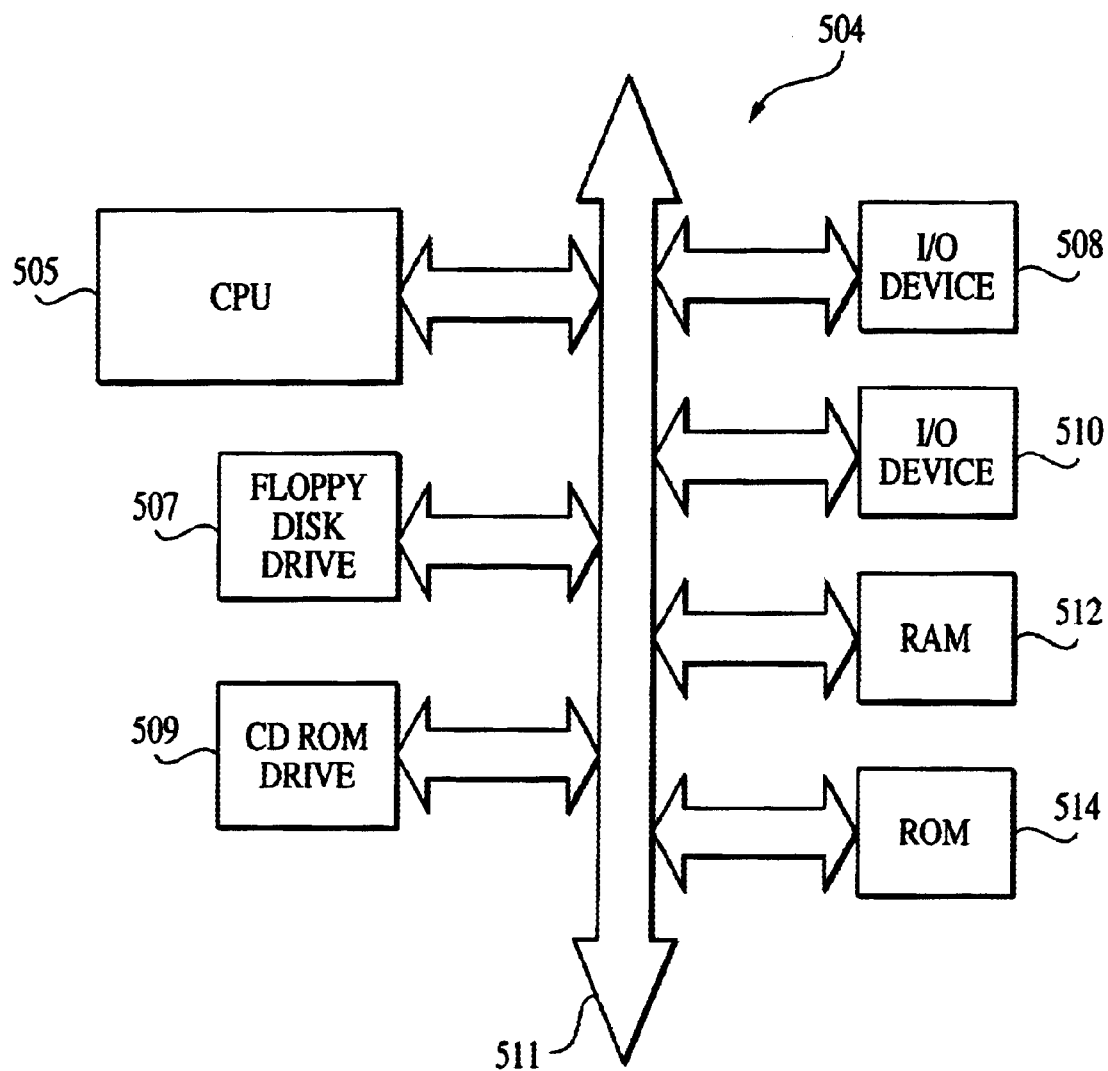
FIG. 5B is a block diagram of a processor-based system using RAM having memory chips constructed in accordance with the present invention.

FIG. 5B is a block diagram of a processor-based system 504 using RAM 512 constructed in accordance with the present invention. That is, RAM 512 uses a DRAM cell such as described in connection with FIG. 3E (or FIG. 6E infra). The processor-based system 504 may be a computer system, a process control system or any other system employing a processor and associated memory. The system 504 includes a central processing unit (CPU) 505, e.g., a microprocessor, that communicates with the RAM 512 and an I/O device 508 over a bus 511. It must be noted that the bus 511 may be a series of buses and bridges commonly used in a processor-based system, but for convenience purposes only, the bus 511 has been illustrated as a single bus. A second I/O device 510 is illustrated, but is not necessary to practice the invention. The processor-based system 504 also includes read-only memory (ROM) 514 and may include peripheral devices such as a floppy disk drive 507 and a compact disk (CD) ROM drive 509 that also communicates with the CPU 505 over the bus 511 as is well known in the art.

Figure 6A:
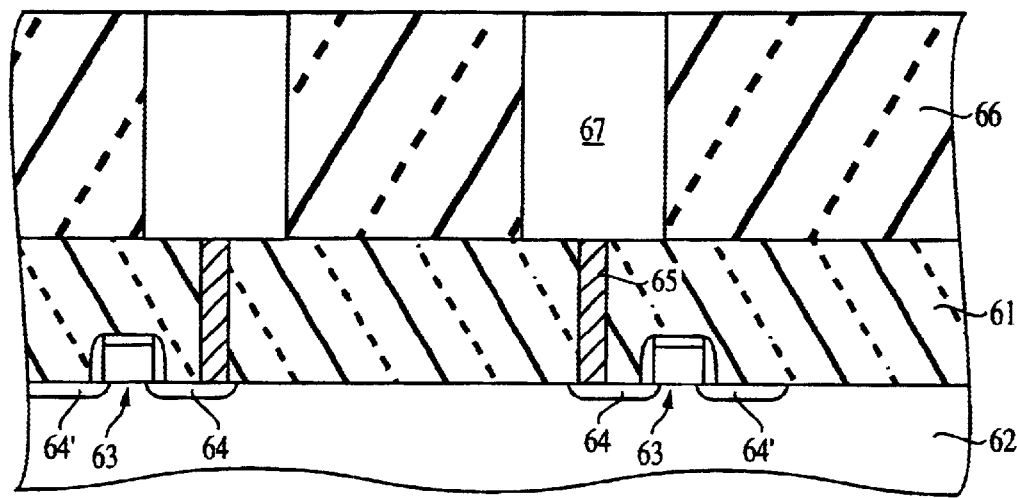
FIGS. 6A through 6E are cross sectional views illustrating an embodiment for manufacturing studs for a capacitor according to the present invention.
Figure 6B:
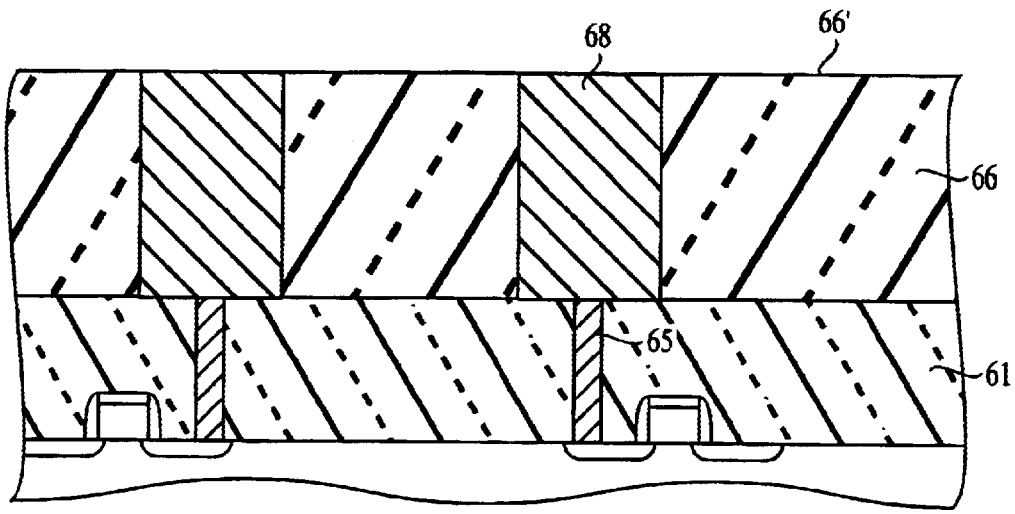
Figure 6C:
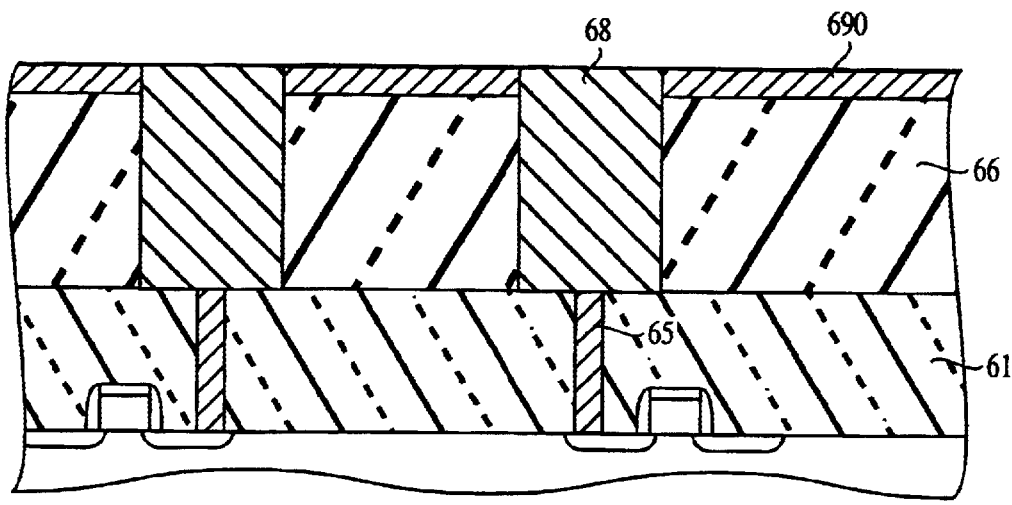
Figure 6D:
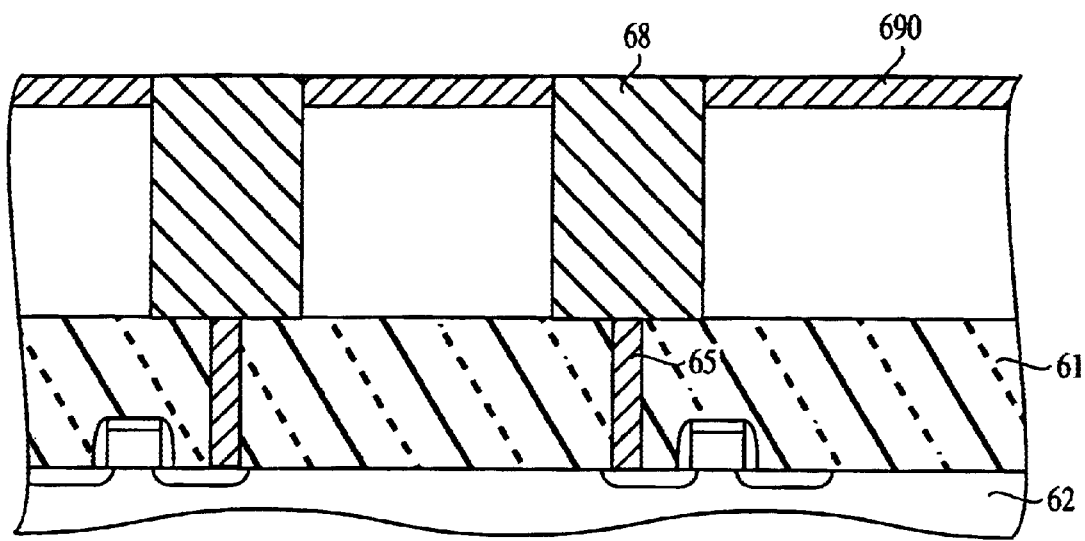
Figure 6E:
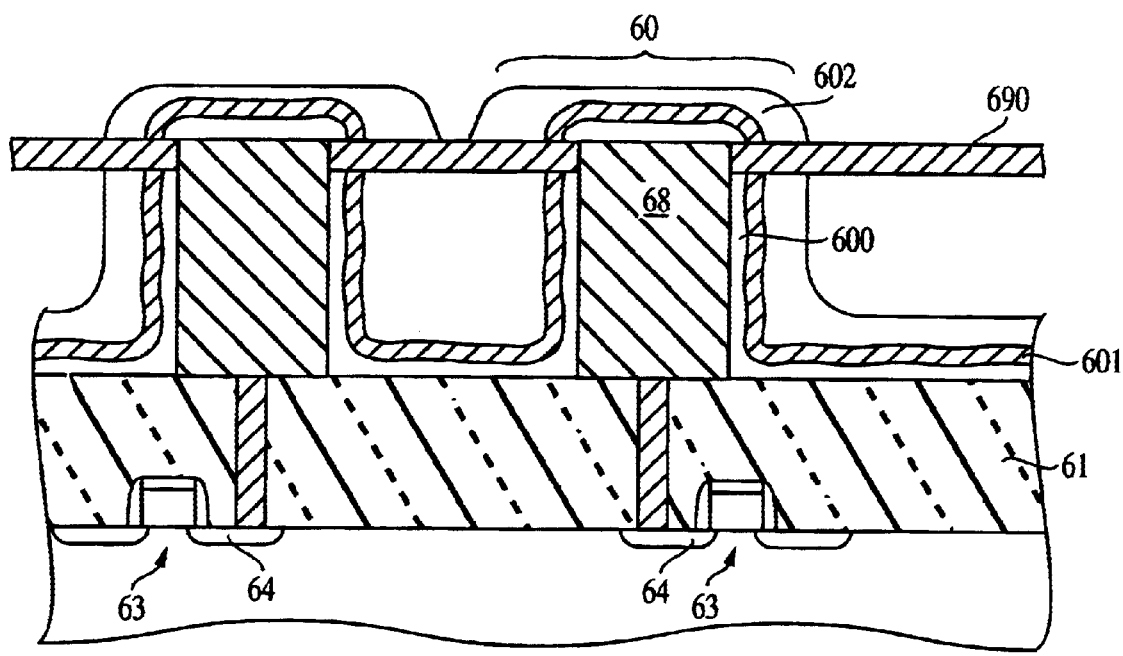
Figure 7A:
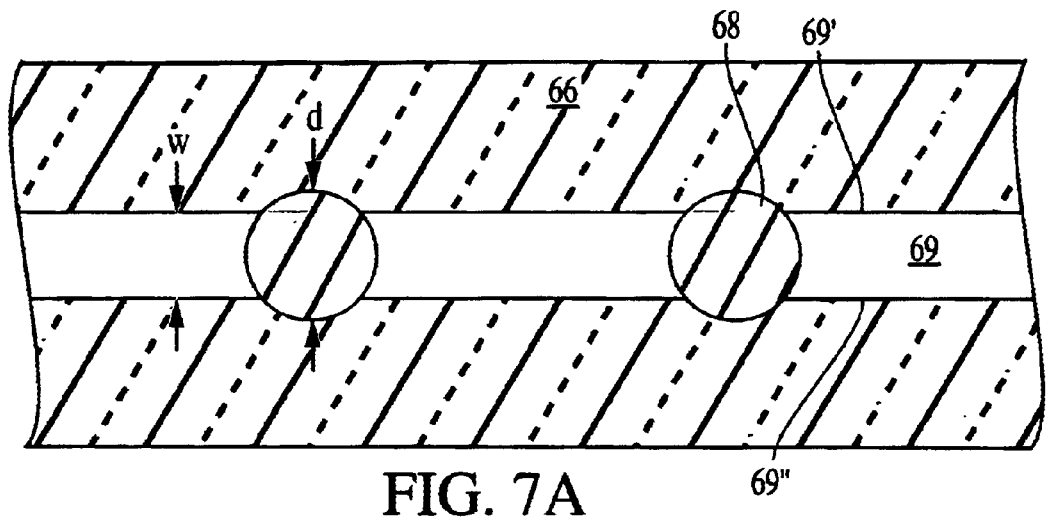
FIGS. 7A and 7B are top views of the cylindrical containers of FIGS. 6A–6E at several intermediate stages of processing.

FIGS. 6A through 6E are cross sectional views illustrating an embodiment for manufacturing studs for a capacitor according to the present invention. In fabricating the inventive stud capacitors, as shown in FIG. 6A, via holes 67 are formed through a second dielectric layer 66 over a first dielectric layer 61 arranged on a semiconductor substrate 62. The substrate 62 has a circuit element 63, such as a transistor, including impurity source and drain regions 64 and 64'. One of the source or drain regions 64 is connected to the via holes 67 via conductive plug 65. After the via hole 67 is formed through the second dielectric layer 66 in alignment with the plug 65 previously formed in the first dielectric layer 61, a metal or other conductive material 68 (e.g., Al, Al-alloys, W, highly doped poly) is deposited so as to fill the via hole 67 and form the stud 68. The metal is removed from the surface of the second dielectric layer 66 by planarization (e.g., CMP) to yield the intermediate structure shown in FIG. 6B. In the next process step, a narrow channel is formed in the surface 66' of the second dielectric layer 66 between the studs 68 and other studs not shown in the partial view using the techniques described above in connection with channel 39 in FIG. 3C. FIG. 7A is a top view of the corresponding intermediate structure showing a narrow channel 69 having sidewalls 69' and 69" formed in the surface of the second dielectric layer 66. The channel width dimension "w" between sides 69' and 69" of the channel 69 is preferably sized to be approximately the stud diameter "d" or smaller, such as approximately 50% of the diameter "d" although not limited thereto.

Figure 7B:
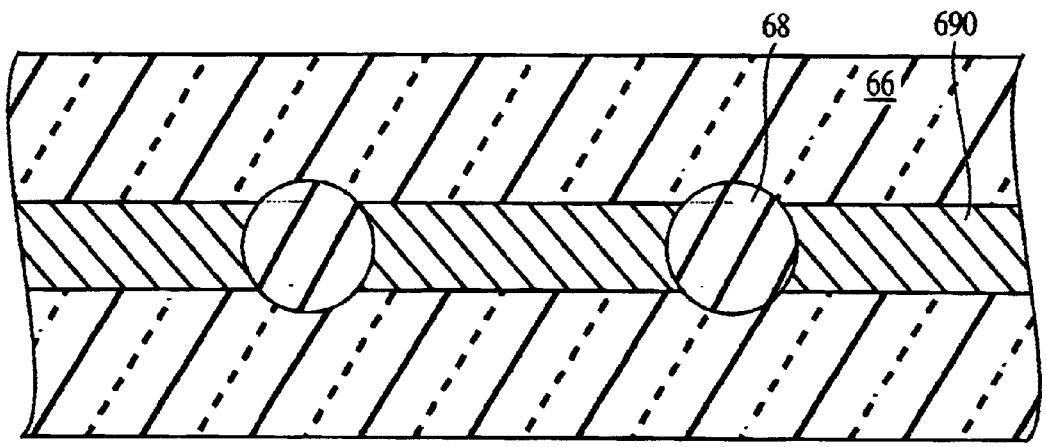

As shown in FIG. 6C, the channel is then filled with a dielectric brace layer 690 similar to brace layer 390 discussed in connection with FIG. 3D except that the dielectric brace layer 690 here interconnects metal studs instead of poly cylinders. The result is also shown in the top view of FIG. 7B.

The second dielectric layer 66 is then selectively etched away by methods described above in connection with FIG. 3E until the first dielectric layer 61 and plug 65 is reached with the resulting structure shown in FIG. 6D. A free standing stud structure 68 is left exposed with transverse structural support from brace layer 690 over the first dielectric layer 61 after removing the second dielectric layer 66. In further processing, the studs 68 have a conductively doped hemi-spherical grain (HSG) poly layer 600 formed on their exterior profile, and a capacitor dielectric film 601 is provided over the entire surface HSG layer 600 of the storage node electrode. Then, a top capacitor electrode 602, such as poly, is formed to complete the storage cell 60. The HSG film, capacitor dielectric film and top electrode layers can be of the constructions described above.

Figure 7C:
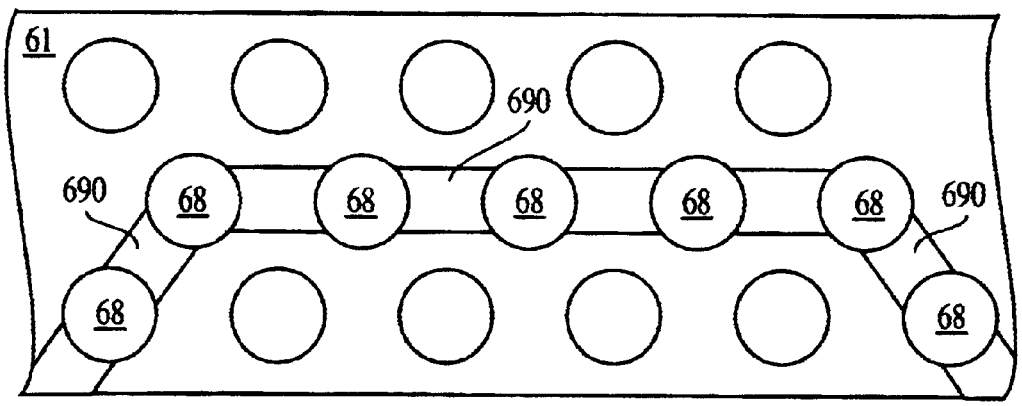
FIG. 7C is a top view representation of an array of capacitors interconnected by a dielectric bracing layer of this invention.

As previously discussed above with reference to FIG. 4C in connection with the container capacitors illustrated in FIG. 3F, but as equally applicable to the stud capacitors of this embodiment, the brace layer 690 may extend to the edge of the die active area for anchoring purposes. In FIG. 4C, each brace layer 390 ultimately extends to the edges of the IC die active circuit area 395, where the brace 390 locks to solid non-active portions 396 and 396' of a die 397 around or adjacent to the fabricated circuitry to further anchor the braced-tall capacitor microstructures. FIG. 7C shows an analogous top view of an IC die active circuit area where the brace 690 extends between studs 68. In this way, the studs 68 are afforded good mechanical support in at least transverse or lateral directions during removal of the second dielectric 66 and further wafer handling and processing operations.

For the embodiments described herein, additional conductive and passivation layers are formed thereover to complete the DRAM devices as is known to those skilled in the art. While the figures only show a limited number of capacitors being formed for sake of clarity, it will be understood that a multitude of cells will be simultaneously fabricated in a similar manner on the substrate. Also, the capacitor can be used in other chips in addition to DRAMs. That is, the invention is applicable to any semiconductor devices needing a capacitor, such as DRAM and embedded DRAM. Although illustrated in connection with cylindrical container, or stud structures, the invention also could be used for a storage node formed as a pillar or villus structure. Also, non-cylindrical shaped containers or studs are also contemplated for practice within the scope of the invention such as bar or rectangular shapes, oval, and so forth. Additionally, the principles and teachings of this invention are generally applicable to other tall microstructures, and are not necessarily limited to features of a capacitor.

While the present invention is described herein with reference to illustrative embodiments for particular applications, it should be understood that the invention is not limited thereto. Those having ordinary skill in the art and access to the teachings provided herein will recognize additional modifications, applications, and embodiments within the scope of the present invention.

What is claimed and desired to be secured by United States Letters Patent is:

1. A semiconductor storage capacitor, comprising:
   a semiconductor substrate;
   a plurality of upright free-standing capacitor storage node microstructures formed over the substrate, said microstructures having vertical surfaces;
   a brace transversely extending between the vertical surfaces of at least two of the free-standing microstructures, said brace being located substantially near the upper ends of said vertical surfaces of said microstructures; and
   a vertical space between said brace and said substrate.

2. The semiconductor storage capacitor according to claim 1, wherein the brace interconnects substantially all of the microstructures.

3. The semiconductor storage capacitor according to claim 1, wherein the brace has a width approximately equal to or less than the largest cross-sectional dimension of the microstructures.

4. The semiconductor storage capacitor according to claim 1, wherein the brace comprises a microbridge structure extending above the substrate and between two or more of the microstructures.

5. The semiconductor storage capacitor according to claim 1, where the microstructures each comprise a conductor material portion standing upright over the substrate, and wherein the brace interconnects the conductor material portions of two or more of the microstructures.

6. The semiconductor storage capacitor according to claim 1, wherein the microstructures comprise generally cylindrical container shapes and the brace comprises a microbridge structure.

7. The semiconductor storage capacitor according to claim 1, where the brace comprises a dielectric material.

8. The semiconductor storage capacitor according to claim 1, further comprising a dielectric layer between the substrate and the brace, where the brace is vertically spaced from the dielectric layer.

9. The semiconductor storage capacitor according to claim 1, wherein the microstructures comprise conductive material and the brace comprises a dielectric.

10. The semiconductor storage capacitor according to claim 1, wherein the microstructures are defined within an active circuit area, and further comprising a die having non-active circuit areas located adjacent the active circuit area, wherein the brace further interconnects at least two of the microstructures with non-active areas of the die.

11. The semiconductor storage capacitor according to claim 1, wherein the microstructures are container capacitors.

12. The semiconductor storage capacitor according to claim 1, wherein the microstructures comprise double-sided container capacitors.

13. A memory circuit, comprising:
    a semiconductor substrate having a memory cell including diffusion regions;
    a dielectric layer on the substrate;
    conductive plugs extending vertically from an upper surface of the dielectric layer to respective diffusion regions;
    a plurality of upright standing capacitor storage node microstructures, having vertical surfaces, each formed over the dielectric layer and a respective conductive plug; and
    a brace transversely extending between and laterally supporting at least two of the vertical surfaces of said microstructures, said brace being suspended over at least one layer of material which extends between said dielectric layer and said brace.

14. The memory circuit according to claim 13, wherein the circuit comprises a DRAM.

15. The memory circuit according to claim 13, wherein the brace interconnects substantially all of the microstructures.

16. The memory circuit according to claim 13, where the brace is located substantially near upper ends of the microstructures.

17. The memory circuit according to claim 13, wherein the brace has a width approximately equal to or less than the largest cross-sectional dimension of the microstructures.

18. The memory circuit according to claim 13, wherein the brace comprises a microbridge structure extending above the substrate and between two or more of the microstructures.

19. The memory circuit according to claim 13, where the microstructures each comprise a conductor material portion standing upright over the substrate, and wherein the brace interconnects the conductor material portions of two or more of the microstructures.

20. The memory circuit according to claim 13, wherein the microstructures comprise generally cylindrical container shapes and the brace comprises a microbridge structure.

21. The memory circuit according to claim 13, where the brace comprises a dielectric material.

22. The memory circuit according to claim 13, where the brace is vertically spaced from the dielectric layer.

23. The memory circuit according to claim 13, wherein the microstructures comprise conductive material and the brace comprises a dielectric.

24. The memory circuit according to claim 13, wherein the microstructures are defined within an active circuit area, and further comprising a die having non-active circuit areas located adjacent the active circuit area, wherein the brace further interconnects at least two of the microstructures with non-active areas of the die.

25. The memory circuit according to claim 13, wherein the microstructures are container capacitors.

26. The memory circuit according to claim 13, wherein the microstructures comprise double-sided container capacitors.

27. A memory device, comprising:
   a memory chip comprising a memory circuit fabricated on the memory chip, said memory circuit comprising:
      a semiconductor substrate having a memory cell including diffusion regions;
      a dielectric layer on the substrate;
      conductive plugs extending vertically from an upper surface of the dielectric layer to respective diffusion regions;
      a plurality of upright capacitor storage node microstructures, having lateral sides with a lower portion and an upper portion, each formed over the dielectric layer and the respective conductive plug; and
      a brace for laterally supporting respective lateral sides of at least two of the microstructures, said brace transversely extending between only said upper portions of said microstructures, wherein a space is disposed between said dielectric layer and said brace.

28. A memory module, comprising:
   a die substrate comprising a circuit board;
   a plurality of memory chips mounted on the die substrate, wherein one or more of the memory chips comprise a memory circuit fabricated on the semiconductor chip communicating with the processor, said memory circuit comprising:
      a semiconductor substrate having a memory cell including diffusion regions;
      a dielectric layer on the substrate;
      conductive plugs extending vertically from an upper surface of the dielectric layer to respective diffusion regions;
      a plurality of capacitor storage node microstructures each formed over the dielectric layer and a respective conductive plug; and
      a brace transversely extending between and laterally supporting respective lateral sides of at least two of the microstructures, wherein at least one layer of material and a space is disposed between said dielectric layer and said brace.

29. A processor system, comprising:
   a processor; and
   a memory circuit fabricated on a semiconductor chip communicating with the processor, said memory circuit comprising:
      a semiconductor substrate having a memory cell including diffusion regions;
      a dielectric layer on the substrate;
      conductive plugs extending vertically from an upper surface of the dielectric layer to respective diffusion regions;
      a plurality of upright capacitor storage node microstructures, having lateral sides, each formed over the dielectric layer and a respective conductive plug; and
      a brace transversely suspended between upper portions of said lateral sides of at least two of the microstructures for supporting said lateral sides.

30. The processor system according to claim 29, wherein the memory circuit comprises a DRAM.

31. The processor system according to claim 29, wherein the capacitor microstructures comprises capacitor containers.

32. A semiconductor capacitor comprising:
   at least two vertical support structures over a substrate each with a lower portion and an upper portion;
   a horizontal brace suspended between said upper portions of said at least two vertical support structures;
   a first conductive material deposited over said at least two vertical support structures and over and in contact with portions of said horizontal brace adjacent said structures;
   a dielectric material deposited over said conductive material and over and in contact with said portions of said horizontal brace; and
   a second conductive material deposited over said dielectric material and over and in contact with said portions of said horizontal brace.

* * * * *